United States Patent
Forrest et al.

(10) Patent No.: US 11,362,310 B2
(45) Date of Patent: Jun. 14, 2022

(54) ORGANIC LIGHT-EMITTING DEVICES USING A LOW REFRACTIVE INDEX DIELECTRIC

(71) Applicant: THE REGENTS OF THE UNIVERSITY OF MICHIGAN, Ann Arbor, MI (US)

(72) Inventors: Stephen R. Forrest, Ann Arbor, MI (US); Yue Qu, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 0 days.

(21) Appl. No.: 16/193,056

(22) Filed: Nov. 16, 2018

(65) Prior Publication Data

US 2019/0157620 A1    May 23, 2019

Related U.S. Application Data

(60) Provisional application No. 62/588,472, filed on Nov. 20, 2017, provisional application No. 62/591,250, filed on Nov. 28, 2017.

(51) Int. Cl.
*H01L 51/52* (2006.01)
*H01L 51/50* (2006.01)

(52) U.S. Cl.
CPC ...... *H01L 51/5271* (2013.01); *H01L 51/5016* (2013.01); *H01L 51/5281* (2013.01); *H01L 51/5234* (2013.01); *H01L 51/5268* (2013.01); *H01L 2251/5315* (2013.01); *H01L 2251/5353* (2013.01)

(58) Field of Classification Search
CPC ............ H01L 51/5271; H01L 51/5281; H01L 51/5016; H01L 2251/5353; H01L 2251/5315; H01L 51/5234
See application file for complete search history.

(56) References Cited

U.S. PATENT DOCUMENTS

| | | | |
|---|---|---|---|
| 4,769,292 | A | 9/1988 | Tang |
| 5,247,190 | A | 9/1993 | Friend |
| 5,703,436 | A | 12/1997 | Forrest |
| 5,707,745 | A | 1/1998 | Forrest |
| 5,834,893 | A | 11/1998 | Bulovic |
| 5,844,363 | A | 12/1998 | Gu |
| 6,013,982 | A | 1/2000 | Thompson |
| 6,087,196 | A | 7/2000 | Sturm |

(Continued)

FOREIGN PATENT DOCUMENTS

| | | |
|---|---|---|
| WO | 2008057394 A1 | 5/2008 |
| WO | 2010011390 A2 | 1/2010 |

OTHER PUBLICATIONS

Baldo et al. Highly efficient phosphorescent emission from organic electroluminescent devices, Nature, vol. 395, pp. 151-154, 1998.

(Continued)

*Primary Examiner* — Eugene Lee
(74) *Attorney, Agent, or Firm* — Riverside Law LLP

(57) ABSTRACT

A device including an organic light emitting diode and a dielectric layer is provided. The dielectric layer provides additional distance between a reflector and the organic emission region, leading to improved reduction in non-emissive modes and enhanced efficiency.

16 Claims, 13 Drawing Sheets

(56) References Cited

U.S. PATENT DOCUMENTS

| | | | |
|---|---|---|---|
| 6,091,195 A | 7/2000 | Forrest | |
| 6,097,147 A | 8/2000 | Baldo | |
| 6,294,398 B1 | 9/2001 | Kim | |
| 6,303,238 B1 | 10/2001 | Thompson | |
| 6,337,102 B1 | 1/2002 | Forrest | |
| 6,468,819 B1 | 10/2002 | Kim | |
| 7,279,704 B2 | 10/2007 | Walters | |
| 7,431,968 B1 | 10/2008 | Shtein | |
| 7,968,146 B2 | 6/2011 | Wagner | |
| 2003/0230980 A1 | 12/2003 | Forrest | |
| 2004/0174116 A1 | 9/2004 | Lu | |
| 2005/0001963 A1* | 1/2005 | Yokoyama | H01L 27/3276 349/122 |
| 2010/0051973 A1* | 3/2010 | Kobayashi | H01L 51/5265 257/88 |
| 2010/0176385 A1* | 7/2010 | Lifka | H01L 51/441 257/40 |
| 2010/0194267 A1* | 8/2010 | Forrest | H01L 51/5212 313/504 |
| 2012/0007083 A1* | 1/2012 | You | H01L 29/41733 257/59 |
| 2012/0169972 A1* | 7/2012 | Jung | G02F 1/133528 349/96 |
| 2013/0334510 A1* | 12/2013 | Mandlik | H01L 51/50 257/40 |
| 2014/0008628 A1* | 1/2014 | Yamana | H01L 51/5262 257/40 |
| 2015/0008403 A1* | 1/2015 | Kudo | H01L 27/3246 257/40 |
| 2015/0031147 A1* | 1/2015 | Anderson | H01L 51/56 438/5 |
| 2015/0155521 A1* | 6/2015 | Mazoyer | H01L 51/5268 257/40 |
| 2015/0188052 A1* | 7/2015 | Burroughes | H01L 51/0021 438/46 |
| 2015/0249212 A1* | 9/2015 | Kim | H01L 51/5231 257/40 |
| 2015/0349231 A1* | 12/2015 | Hsieh | H01L 33/62 257/98 |
| 2016/0111223 A1* | 4/2016 | Bryant | H01L 51/0024 136/256 |
| 2016/0204384 A1* | 7/2016 | Sekine | H01L 51/5206 257/40 |
| 2016/0268538 A1* | 9/2016 | Schwab | H01L 51/5212 |
| 2016/0372711 A1* | 12/2016 | Song | H01L 51/56 |
| 2017/0033318 A1* | 2/2017 | Wu | H01L 51/0096 |
| 2017/0033320 A1* | 2/2017 | Harkema | G02B 5/3016 |
| 2017/0170421 A1* | 6/2017 | Xu | H01L 51/52 |
| 2017/0229663 A1 | 8/2017 | Tsai | |
| 2017/0243932 A1* | 8/2017 | Ohara | H01L 51/5012 |
| 2017/0288174 A1* | 10/2017 | Ueda | H01L 51/5228 |
| 2018/0309090 A1 | 10/2018 | Boutami | |
| 2018/0321762 A1* | 11/2018 | Lee | G06F 3/0418 |
| 2018/0321778 A1* | 11/2018 | Lee | G06F 3/04166 |
| 2019/0006627 A1* | 1/2019 | Li | H01L 51/5218 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

\* cited by examiner

ORGANIC LIGHT-EMITTING DEVICES USING A LOW REFRACTIVE INDEX DIELECTRIC

CROSS-REFERENCE TO RELATED APPLICATIONS

This application is a non-provisional of, and claims the priority benefit of U.S. Provisional Patent Application Ser. Nos. 62/588,472, filed Nov. 20, 2017, and 62/591,250, filed Nov. 28, 2017, the entire contents of each of which are incorporated herein by reference.

GOVERNMENT RIGHTS

This invention was made with government support under DE-EE0007626 awarded by the U.S. Department of Energy. The government has certain rights in the invention.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and Universal Display Corporation. The agreement was in effect on and before the effective filing date of the presently claimed invention, and the claimed invention was made as a result of activities undertaken within the scope of the agreement.

FIELD

The present invention relates to devices, such as organic light emitting diodes that include a low refractive index dielectric layer and devices including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to an embodiment, a device is provided that includes a substrate; an organic light emitting diode (OLED) disposed over the substrate, the OLED comprising an organic emissive layer disposed between a first electrode and a second electrode; a reflective layer comprising a reflective material disposed in a stack with the OLED; and a dielectric layer comprising a dielectric material disposed in a stack with the OLED and the reflective layer. The dielectric layer may be disposed between the reflective layer and the OLED, or between the OLED and the substrate. An anti-reflective layer may be disposed above the OLED. The reflective layer may include a patterned grid of raised regions of the reflective material. The reflective layer may include at least one of Ag, Al, chromium, Au, platinum, and alloys thereof, a multi-layer dielectric, or a distributed Bragg reflector. The grid may have a periodicity of at least twice a peak wavelength of light emitted by the OLED, and/or of not more than 20 microns. The dielectric material may extend into regions between the raised regions of the reflective layer. The dielectric material may have an index of refraction of not more than 1.5, not more than 2.2, or the like. The dielectric layer may have a thickness of at least than 5 nm. Each of the electrodes in the device may be transparent or semi-transparent.

BRIEF DESCRIPTION OF THE DRAWINGS

FIG. 9A shows the waveguide modes and SPP modes at $u>n_{air}/n_{org}$, of the cavities over the gridlines. FIG. 9B shows the same modes over the depressions. FIG. 9C shows the power distribution of a conventional TEOLED optimized over the same spectral range. The plots above each map show the power distributions at a wavelength of λ=540 nm.

FIG. 10A shows the dependence without an AR coating. FIG. 10B shows the dependence with a 70 nm thick low refractive (n=1.37) anti-reflection (AR) coating according to an embodiment disclosed herein. The device with the AR coating shows a broader spectrum and smaller blue shift at larger angles.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton." which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998, ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
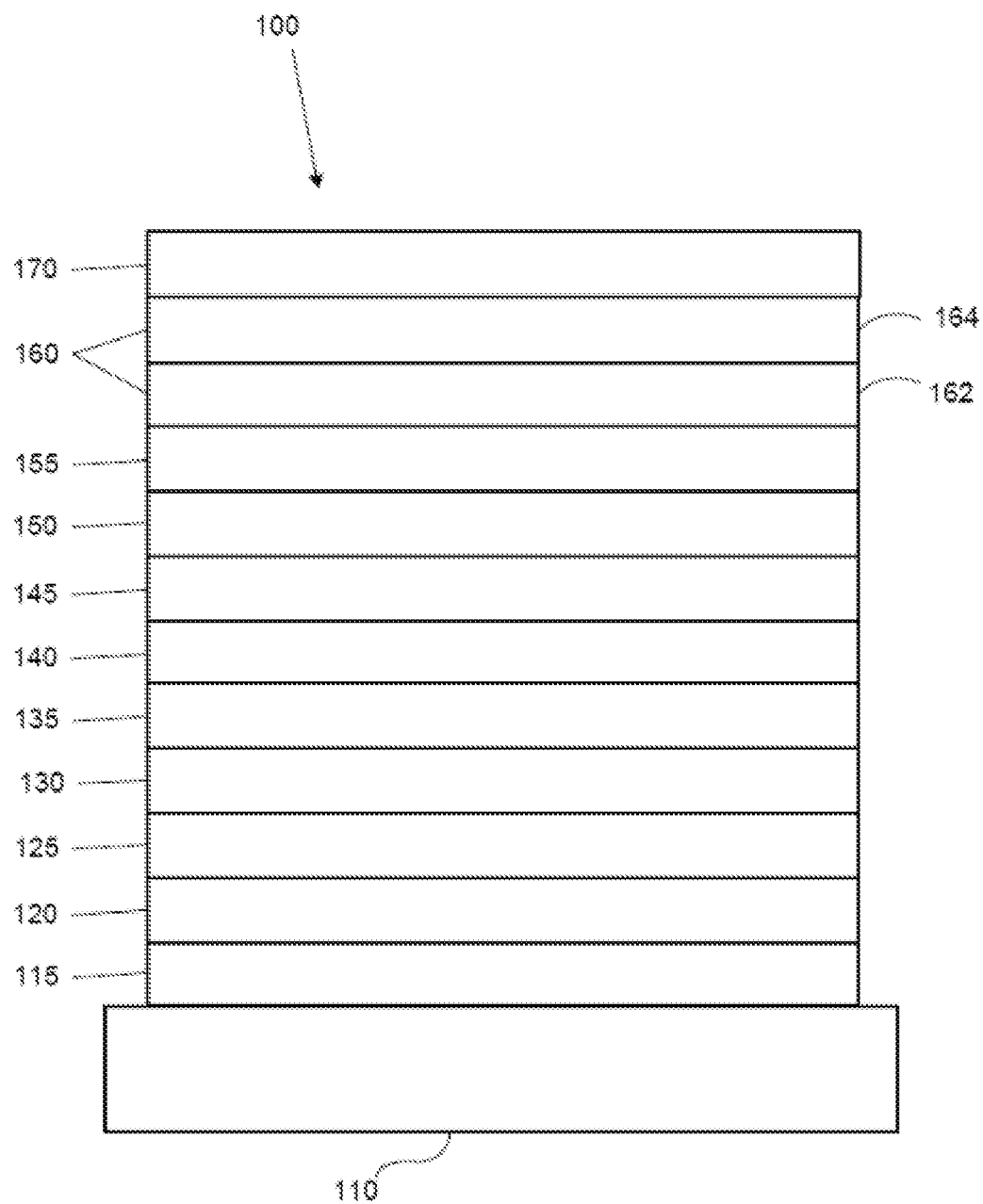
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
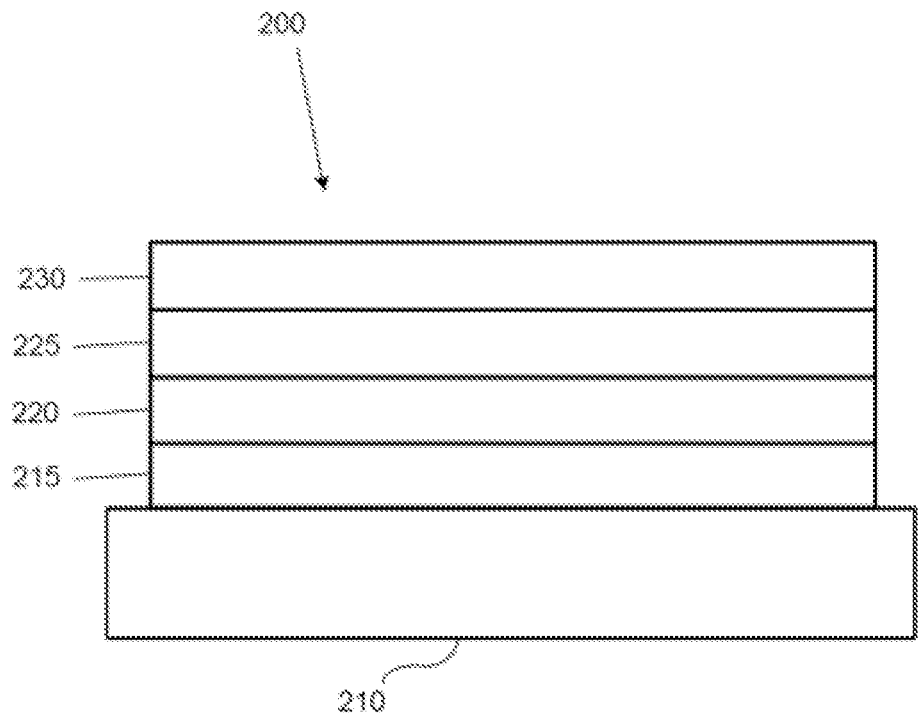
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In many conventional OLED arrangements, the optical outcoupling efficiency often is around 20%, it is expected that the major loss channels for trapped light (beyond modes trapped in the substrate) are waveguide and surface plasmon polariton (SPP) modes. Waveguide modes propagate tens of microns and can be efficiently scattered out of the device with appropriate outcoupling structures. In contrast, SSP modes are excited primarily in the metal cathode, and only propagate a few microns and dissipate before scattering. Thus, it may be desirable to suppress SSPs while extracting waveguided power to achieve OLED external quantum efficiencies, $\eta_{EQE}$, of about 70% or more.

Some OLED arrangements may be impacted less by the trapping of optical power than others, and/or the optical power may be trapped at different parts of the device. For example, unlike bottom-emitting OLEDs, top-emitting devices emit through a semi-transparent electrode into air and do not suffer from optical power trapping within the substrate. However, the higher reflectivity of the semi-transparent top electrode may create a strong optical cavity that introduces additional lossy waveguide modes along with undesirable angle and wavelength dependences of the emission spectrum. Furthermore, since both electrodes in top-emitting devices are often metal, it typically is not possible to entirely suppress SPP modes using thick organic layers without also lowering efficiency. Various techniques may be used to overcome inefficient optical extraction in top-emitting devices. Such techniques typically rely on three different mechanisms: cavity effects, scattering light with corrugations, and the use of microlens arrays (MLAs) or scattering films on the device emitting surfaces. However, enhancements of most of these strategies remain limited by the excitation of SPP modes. Another conventional technique to reduce or eliminate SPPs is to use a thick organic layer between the emissive layer and a metal electrode. However, the thicker organic layers typically introduce more waveguided light, which results in a similar overall light extraction efficiency.

Accordingly it may be desirably to use a low refractive index organic electron transport layer to reduce or eliminate SPP modes. However, it may be difficult or impossible to produce an acceptable organic material with a low refractive index and acceptable electrical properties.

Figure 3:
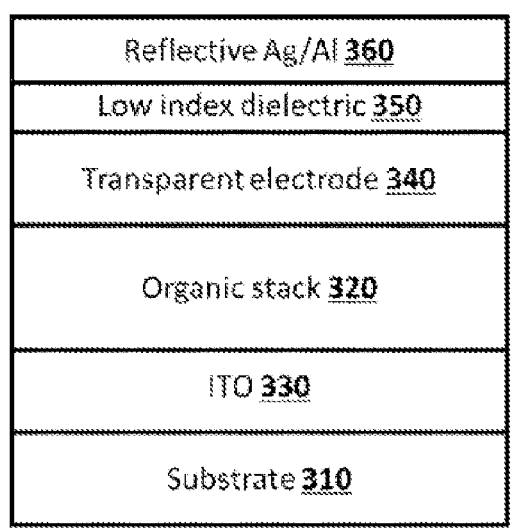
FIG. 3 shows an example device including an OLED and a dielectric layer according to an embodiment disclosed herein.

To overcome this shortcoming, embodiments disclosed herein use a low refractive index dielectric layer disposed between a transparent or semi-transparent electrode and a metal reflector in both top- and bottom-emitting OLED configurations. FIG. 3 shows an example structure of such a device. The device may include or be disposed on a substrate 310. One or more organic layers 320 such as those described with respect to FIGS. 1 and 2 may be disposed between electrodes 330, 340. Some or all of the substrate 310 and the electrodes 320, 330 may be transparent or semi-transparent. A dielectric layer 350 may be disposed between the upper electrode 340 and a reflective layer 360, such as a layer of Ag, Al, or the like. More generally, the dielectric layer 350 may be disposed at various points in the OLED device stack. i.e., in a stack with the OLED structure 330/320/340. The dielectric layer may be disposed between the reflective layer 360 and the OLED, or it may be disposed on the other side of the OLED, i.e., between the OLED and the substrate, as shown in FIG. 4.

The dielectric layer may include one or more dielectric materials, such as transparent silicon oxide, magnesium fluoride, or the like, and may have an index of refraction of not more than 1.5, not more than 2.2, or any intervening maximum value. As described in further detail below, the dielectric layer may have various thicknesses while still providing the benefits and features disclosed herein. In some configurations the dielectric layer may have a thickness of at least 5 nm.

Figure 7:
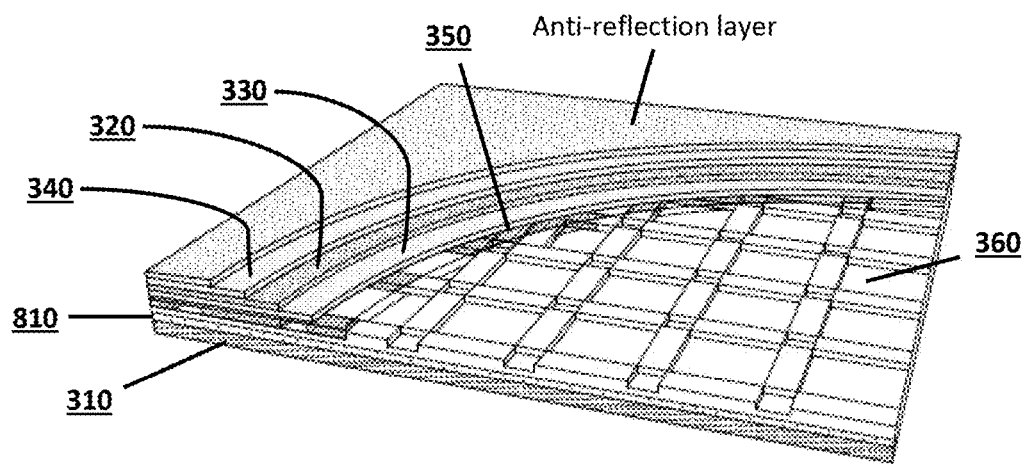
FIG. 7 shows a schematic cut away view of a top-emitting organic light emitting device (TEOLED) that includes a dielectric layer and a grid according to an embodiment disclosed herein.

As described in further detail herein, in some configurations the dielectric layer 350 and the reflective layer 360 may be arranged as a patterned grid, such that the reflective layer is arranged in a grid and the dielectric material from the dielectric layer fills in the unfilled portions of the reflective layer. As used herein, a "patterned" layer is one that has a repeated pattern of regions of varying thickness across the layer. For example, a patterned layer having a "grid" pattern may have rectangular regions that are arranged in a repeating pattern across a plane parallel to the substrate, in which the layer is alternately thicker and thinner in adjacent regions. A specific example of such a patterned grid layer is shown in FIG. 7.

Figure 4:
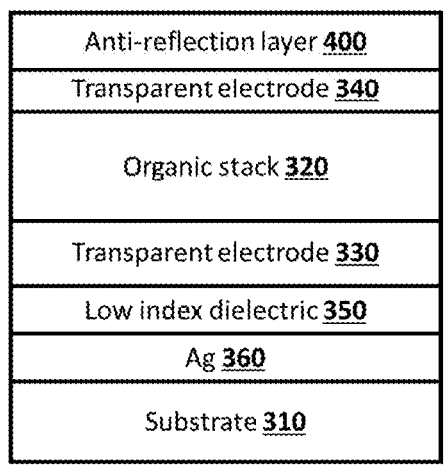
FIG. 4 shows an example device including an OLED, a dielectric layer, and an antireflective layer according to an embodiment disclosed herein.

FIG. 4 shows a top-emitting device similar to that shown in FIG. 3, which includes an anti-reflection (AR) layer 400 disposed over the top electrode 340, with the dielectric layer 350 disposed between the electrode/organic/electrode structure (320,330,340 collectively) and the reflective layer 360. More generally, in some devices as disclosed herein the dielectric layer may be disposed between the basic OLED structure and the substrate. A reflective layer may be disposed between the dielectric layer and the substrate, and/or an anti-reflection layer may be disposed over the device as shown.

Various materials and arrangements may be used for the layers as disclosed herein. For example, a reflective layer 360 may include various metals such as Ag, Al, Cr, Pt, or similar materials and/or alloys thereof. In some cases the reflective layer may be a distributed Bragg reflector or other multi-layer dielectric arrangement made from any suitable material. More generally, the reflective layer may include any materials having a broad reflection spectrum within the emission spectrum of the emissive layer or layers within the OLED.

Figure 5A:
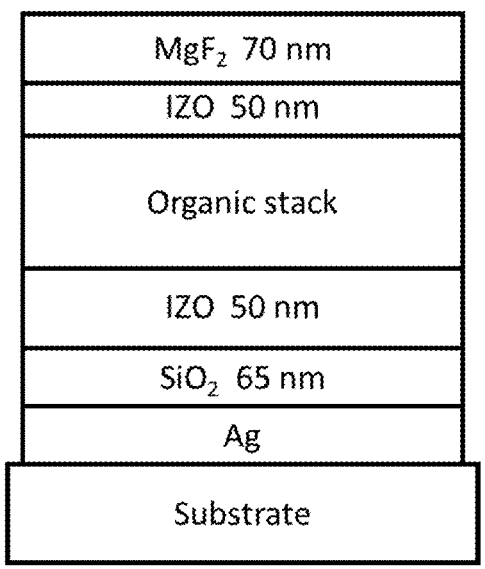
FIG. 5A shows an example device including an OLED, a dielectric layer, and an antireflective layer according to an embodiment disclosed herein.
Figure 5B:
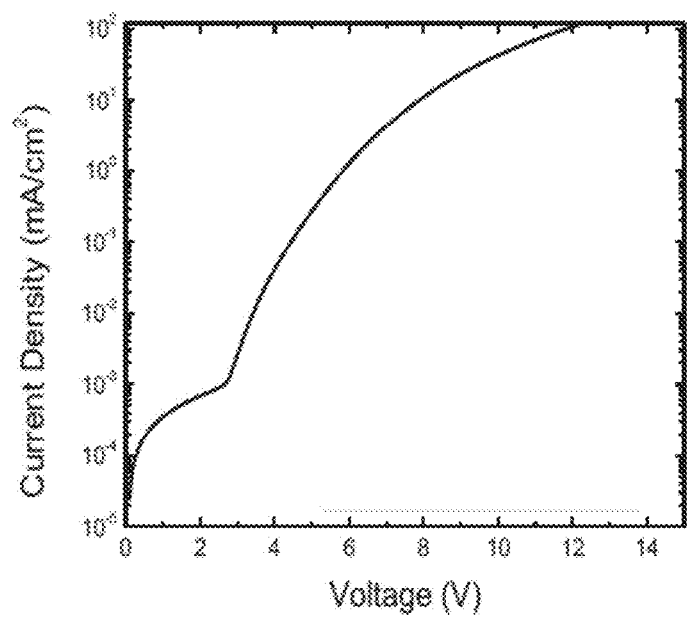
FIG. 5B shows the current density as a function of voltage for the device shown in FIG. 5A.
Figure 5C:
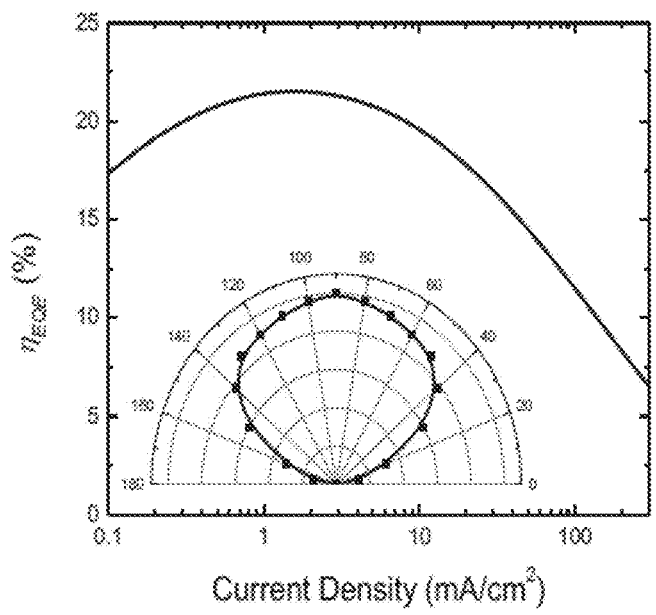
FIG. 5C shows the external quantum efficiency and emission for the device shown in FIG. 5A.
Figure 5D:
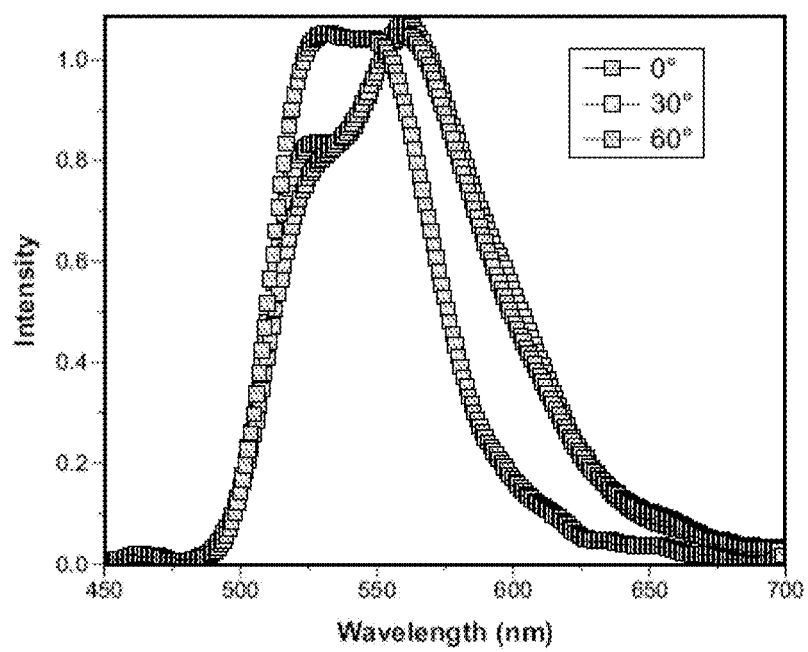
FIG. 5D shows the emission intensity of the device shown in FIG. 5A at several emission angles.
Figure 6:
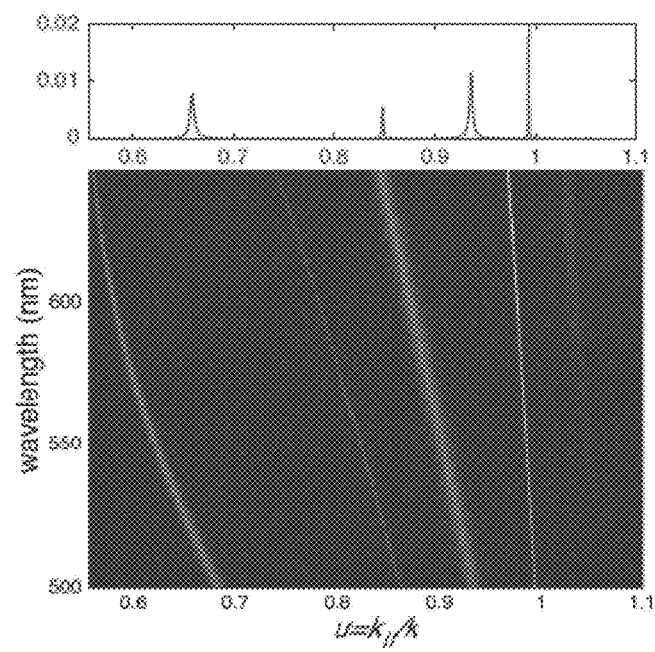
FIG. 6 shows a Green's analysis of the device shown in FIG. 5A.

A device as shown in FIG. 4 was fabricated and tested. The device was a Tris[2-phenylpyridinato-C2,N]iridium(III) green phosphorescent OLED, with a structure of 65 nm $SiO_2$/50 nm indium zinc oxide (IZO)/30 nm $MoO_3$/130 nm organic layers/30 nm $MoO_3$/50 nm IZO/70 nm $MgF_2$, as shown in FIG. 5A. FIG. 5B shows the observed current density of the device as a function of voltage. The observed and measured external quantum efficiency and angular intensity profile are shown in FIG. 5C. It was found that the $MgF_2$ layer functions as an anti-reflection layer to reduce cavity effects of the PHOLED, as shown in FIG. 5D, which shows the emission intensity as a function of wavelength for emission angles of 0, 30, and 60 degrees. As described in further detail below, a device as disclosed herein may be analyzed using a Green's function analysis of the power distribution of the device. FIG. 6 shows the Green's function analysis of the power distribution of the device shown in FIG. 5A, with the plot above the map showing the power distribution at a wavelength of λ=540 nm. The ratio of the in-plane component of the wavevector, $k_\|$, for light propagating in the organic layers with refractive index of no, to the total wavevector k, (i.e. $u=k_\|/k$) generally describes the resulting modes of the device. The region u>1 corresponds to evanescent waves in the near field. As described in further detail below, modes with $u<n_{air}/n_{org}$ typically are radiative, modes in which $n_{air}/n_{org}<u<1$ are waveguided, and modes for which u>1 are SPPs. This analysis indicates that the SPPs mode is negligible due to the presence of the low refractive index dielectric layer between the transparent electrode and the metallic reflector.

Alternatively or in addition, top-emitting diode structures as disclosed herein may replace both anode and cathode with transparent contacts, such as indium zinc oxide (IZO)/ molybdenum trioxide ($MoO_3$) transparent contacts, and place a reflective and scattering corrugated metal-coated dielectric mirror beneath the electrically active organic region. This arrangement also may be combined with a low refractive index antireflection (AR) layer to reduce microcavity effects.

In an embodiment, a grid may be used in conjunction with the dielectric layer. A schematic diagram of a device according to such an embodiment is shown in FIG. 7. The device includes a substrate 310, OLED structure 330/320/340, and reflective layer 360 as previously disclosed. The reflective layer 360 may be arranged in a patterned grid, the lower spaces or voids of which may be filled by the dielectric material 350. The dielectric material layer 350 also may extend above the highest point of the reflective layer 360, effectively forming a spacer layer above the reflective/ dielectric grid arrangement. Similarly, an additional uniform reflective layer 810 may be disposed between the reflective layer 360 and the substrate 310.

Figure 8A:
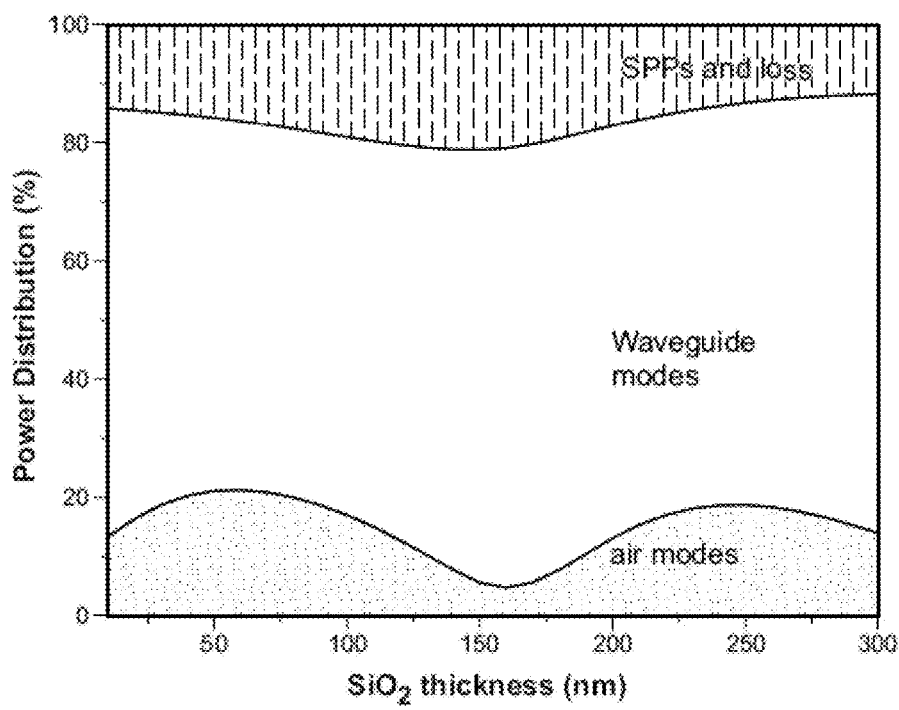
FIG. 8A shows an example of the dependence of the modal power distribution on the thickness of a spacer layer thickness in a device according to an embodiment disclosed herein.

An arrangement as shown in FIG. 8A spaces the active region away from the metal reflector to reduce or minimize coupling to SPP modes, while scattering out the waveguided optical power without disturbing the planarity of the device itself. Employing a scattering structure such as within the substrate while retaining a planar substrate surface allows for control in adjusting and optimizing the scattering layer dimensions without affecting the electrical properties of the OLED.

The reflective layer 360 may have a periodicity on the order of one to several wavelengths of a peak wavelength of light emitted by the OLED so as to avoid angle- and wavelength-dependent effects. Specifically, the period of the grid (i.e., the distance, measured across the substrate, of the portion of the layer that repeats across the layer) may be equal to at least twice the wavelength of light emitted by the emissive layer 320. In some configurations the period of the grid may be not more than 20 μm.

The dielectric layer 350 may fill the depressions of the grid 360 as previously disclosed, which may provide a planar surface for subsequent deposition of the electrodes and organic layers of the OLED. As previously disclosed, the dielectric or spacer layer 350 also may extend above the grid. The thick and thin regions of the dielectric layer 350 may couple differently to microcavity modes within the OLED by locally creating both thick and thin cavity regions beneath the electrode. To improve or optimize light extraction from the two cavity regions, the effects of the spacer thickness may be considered using a Green's function analysis as shown in FIG. 8A. An active region of a 130 nm-thick organic layer ($n_{org}$=1.8) between 80 nm-thick transparent electrodes (50 nm IZO and 30 nm $MoO_3$, each with n=2.0) was used as a simulation structure, with the emission layer (EML) placed at 60 nm above the bottom electrode. A randomly oriented green-emitting molecular dipole was placed at the position of EML. The spacer refractive index is n=1.5. The optical outcoupling efficiency is >20% when spacer layer thicknesses are 65 nm and 245 nm. Most of the optical power is lost into waveguide modes due to the elimination of SPPs, as shown.

Figure 8B:
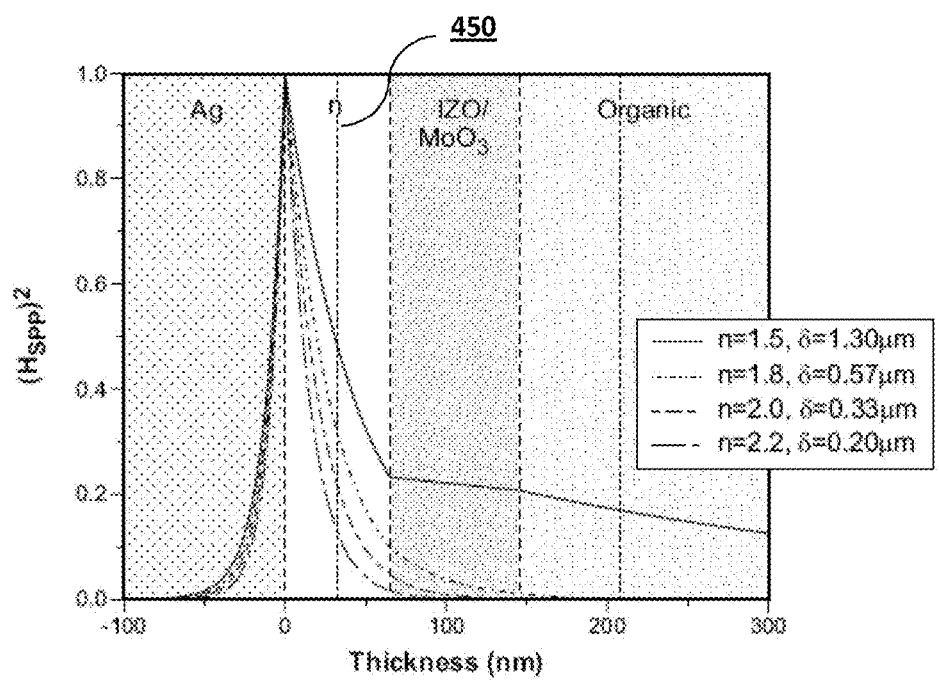
FIG. 8B shows the surface plasmon mode magnetic field intensity across the control device structure with different refractive indexes, n, and the surface plasmon polariton (SPP) mode propagation length, δ according to an embodiment disclosed herein.

SPP coupling in the thick and thin cavities may be modeled by calculating the local electric field of the plasmon mode at the EML, E(z). The emission rate into the SPP mode is found using Fermi's Golden rule:

$$\Gamma(\omega) = \frac{2\pi}{\hbar} |<i|d \cdot E(z)|f>|^2 \rho(\hbar\omega).$$

where d denotes the exciton dipole moment, i and f are the initial and final exciton state wavefunctions, respectively, and $\rho(\hbar\omega)$ is the plasmonic mode density. The distance of the exciton from the metal interface is z, and E(z) is the electrical field of the SPP mode normalized to a half quantum for zero-point fluctuations. The magnetic field intensity profiles of SPP modes in the OLED cavities are shown in FIGS. 4B and 4C, and may be described using the dispersion relation:

$$k_{SPP}^2 = \frac{\varepsilon_m \varepsilon_d}{\varepsilon_m + \varepsilon_d} \left(\frac{2\pi}{\lambda}\right)^2.$$

where the wavelength λ=510 nm. Since the skin depth of the modes are comparable or smaller than the dielectric thickness, the model presumes a semi-infinite metal layer having a dielectric constant $\varepsilon_m$ in contact with a semi-infinite dielectric layer with dielectric constant, $\varepsilon_d$. FIG. 8B shows the calculated mode profiles in the regions where the cavity is thin. i.e., the areas where the grid lines are raised, for different values of the index of refraction of the spacer layer, n. The calculated propagation lengths of SPP modes ($\delta SPP$=1/(2Im($k_{SPP}$))) are also shown. It can be seen that the field intensity in the EML, and the propagation length decrease as the refractive index of the spacer layer increases. For comparison, the dotted line 450 indicates a typical distance from the EML to the metal in a conventional top-emitting OLED (TEOLED). In such a device, the local field of the SPP mode in the EML is larger than in the arrangements disclosed herein (shown by the black dotted line), leading to faster exciton coupling rate to SPPs.

Figure 8C:
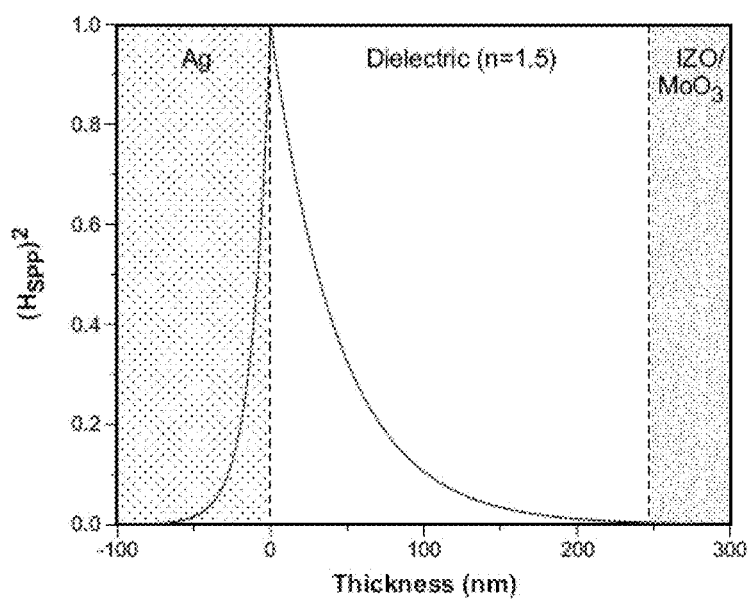
FIG. 8C shows the field intensity over deeper grid regions of the device, with dielectric layer thickness of 245 nm and n=1.5 according to an embodiment disclosed herein.

FIG. 8C shows that the SPP decays before reaching the organic layers in a thick cavity with n=1.5. The coupling to SPP modes decays exponentially as the distance increases between the EML and metal surface. Thus, it has been found that SPP coupling can be reduced or avoided by sing nonmetallic electrodes and an appropriate choice of spacer material and thickness.

Figure 9A:
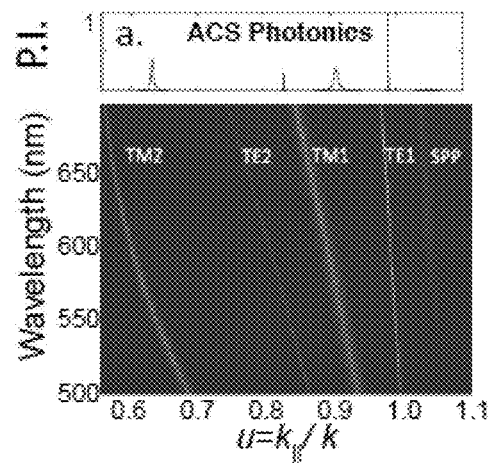
FIGS. 9A-9C show modal power distributions within the cavities of a device according to an embodiment disclosed herein.
Figure 9B:
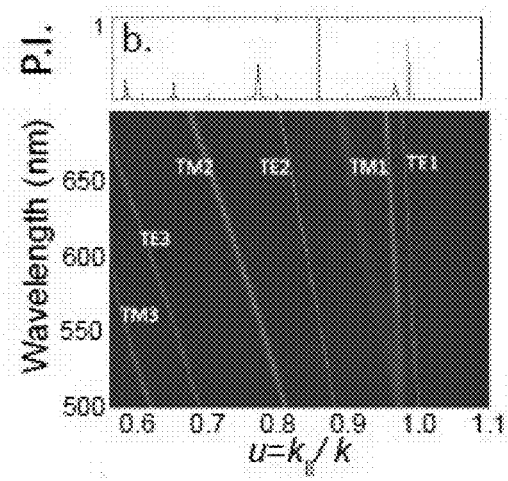

FIGS. 9A and 9B show simulated modal power distributions of the cavities in the same device using a Green's function analysis. In this analysis, u is defined as the ratio of the in-plane component of the wavevector, $k_\parallel$, for light propagating in the organic layers with refractive index of $n_{org}$, to the total wavevector k, i.e. u=$k_\parallel$/k. Thus, the region u>1 corresponds to evanescent waves in the near field. Usually, modes with u<$n_{air}$/$n_{org}$ are radiative, modes in which $n_{air}$/$n_{org}$<u<1 are waveguided, and modes in the region u>1 are SPPs. For a thin cavity, there are four waveguide modes in the emission spectrum, and a weak SPP mode. The thick cavity adds three more waveguide modes but has no SPP modes.

Figure 9C:
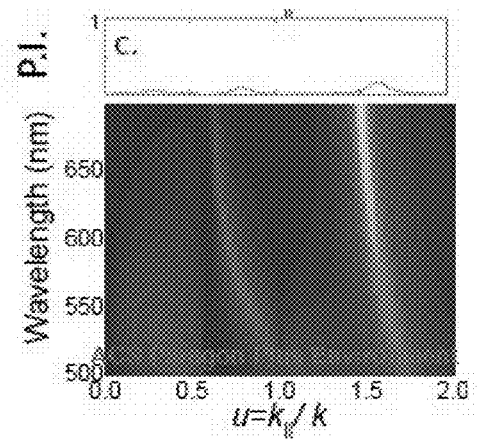

FIG. 9C shows the power distribution of a conventional TEOLED optimized over the same spectral range, with the structure Ag/90 nm organic layers/20 nm-thick top Ag layer, with a 20 nm-thick EML centered in the organic active region. This structure does not support waveguide modes but has two SPP modes. The first SPP mode is seen at u≈0.6 and λ≈540 nm and is supported by the top thin Ag film. According to the dispersion relation previously described and given that $n_{air}$<$n_{org}$, this SPP mode lies in the region of u<1 rather than u>1 for organic/metal SSPs. The second SPP mode supported by the Ag/organic interface is seen at u>1.5. FIGS. 9A-9C show that, compared to conventional devices, both the control and metal coated grid devices successfully suppress SPP modes while coupling more power into the waveguide modes.

It is believed that the observed scattering by the grid is a consequence of the mismatch between the waveguide modes supported by the two cavities above the grid lines and depressions, which can be estimated by the overlap of the wavevectors of these modes. The TE1 and TM1 modes in thin SiO2 cavity, as shown by FIG. 9A, have some overlap with the TE1 and TM1 modes in the thick cavity as shown in FIG. 9B, and thus these modes are inefficiently scattered. The modes that are not aligned between cavities are scattered by the grid. The spacer thicknesses determine the mismatch of the modes, but freedom to optimize the spacer thickness is limited when matching the cavity resonance to the OLED emission spectrum.

Figure 10A:
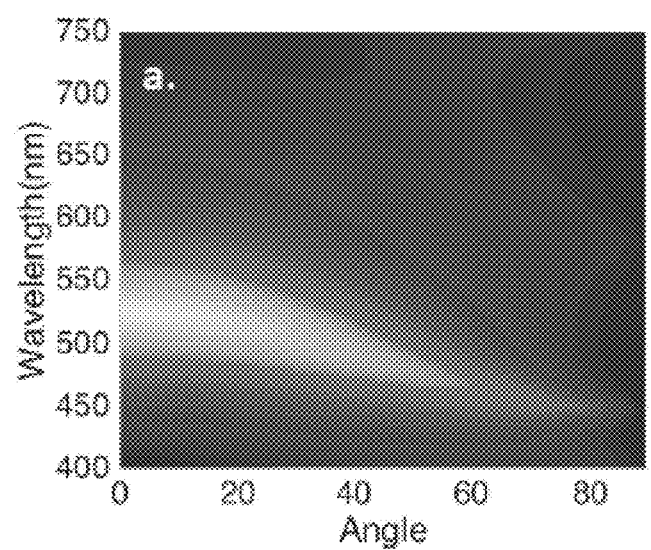
FIGS. 10A and 10B show simulated angle and wavelength dependence of a device as disclosed herein.
Figure 10B:
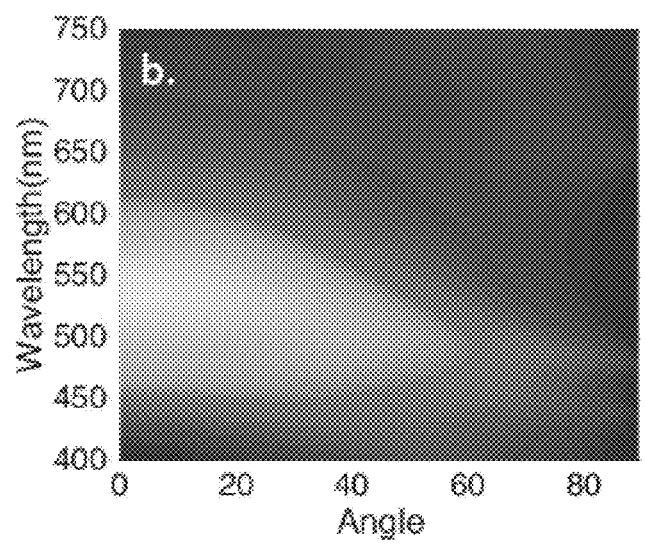

FIG. 10A shows a simulated output of a dipole in the thin $SiO_2$ cavity regions using Green's function analysis. As shown, the output is found to have a relatively strong angle dependence. The spectral peak wavelength ranges from λ=545 nm normal to the plane (0°), to λ=460 nm at 90°. A 70 nm thick low refractive index anti-reflection (AR) layer between air and the top IZO electrode reduces the cavity effects, as is apparent by the spread in wavelength emission and reduced blue shift with angle in FIG. 10B. An example AR coating material is $MgF_2$, which has a refractive index of 1.38 in the range of the emission spectrum. This is relatively close to the optimized value of n=1.4 for IZO/air interfaces.

Figure 12A:
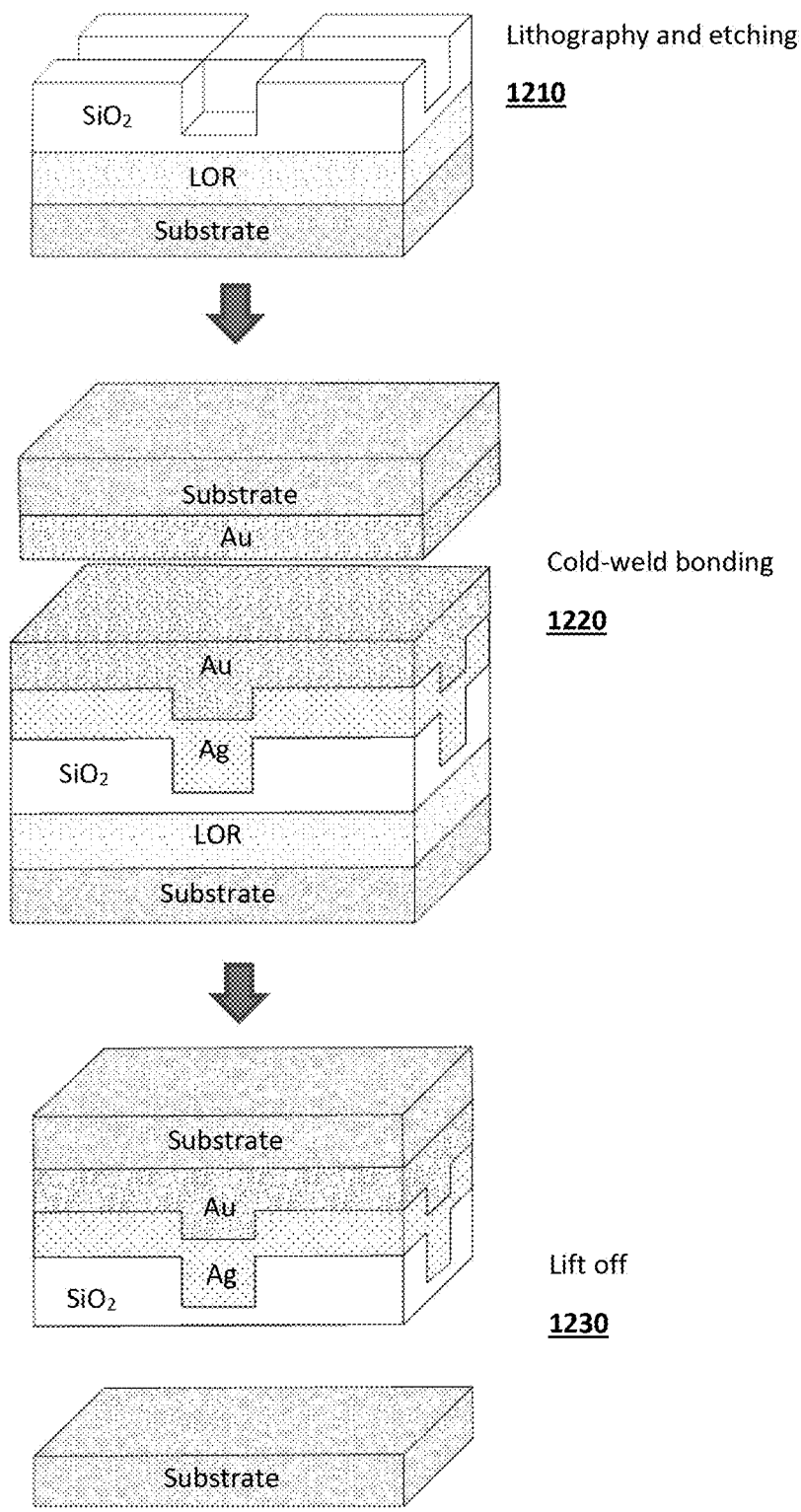
FIG. 12A shows an example fabrication sequence of a device as disclosed herein.
Figure 12B:
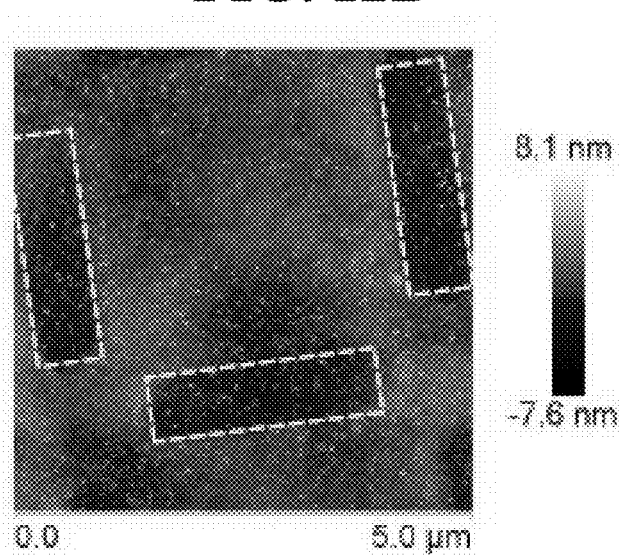
FIG. 12B shows an and atomic force microscope image of the grid surface. There is deformation over the grid line area, and the root mean square surface roughness is 1.2 nm. The height difference due to the deformation is <5 nm.

Devices and structures disclosed herein may be fabricated in a variety of ways. Those portions of the devices disclosed herein that are common to conventional structures, such as various organic layers, electrodes, and the like, may be fabricated using any known suitable technique. FIG. 12A shows an example of a technique to fabricate a device as disclosed herein that includes a patterned grid electrode layer. At 1210, a patterned grid layer of a dielectric material, such as $SiO_2$, may be fabricated on a first substrate. The patterned grid may be formed, for example, via lithography and/or etching processes. At 1220, the reflective layer, such as a layer of Ag and/or Au, may be deposited over the patterned grid. As previously disclosed, this may result in a patterned grid reflective layer, such as the patterned Ag layer, and/or an additional planarizing spacer layer of another metal, reflector, or the like, such as the planar Au layer. Furthermore, the additional layer may be used to cold-weld the structure to a second substrate as shown. At 1230, the desired structure may be removed from the first substrate. Additional layers, such as the OLED structures disclosed herein, then may be fabricated on the dielectric layer.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

EXPERIMENTAL

A control device was fabricated using IZO/MoO$_3$ electrodes and a device as disclosed herein was fabricated with a metal coated grid having the same active layer, as follows, starting from the substrate: 50 nm IZO/30 nm MoO$_3$/30 nm 4,7-diphenyl-1,10-phenanthroline (BPhen):Li (molar 1:1)/ 30 nm BPhen/30 nm Ir(ppy)$_3$ doped at 8 vol % in 4,4'-bis (carbazol-9-yl)biphenyl (CBP)/40 nm 4,4'-cyclohexylidenebis[N, N-bis(4-methylphenyl)benzenamine] (TAPC)/30 nm MoO$_3$/50 nm IZO.

Figure 11A:
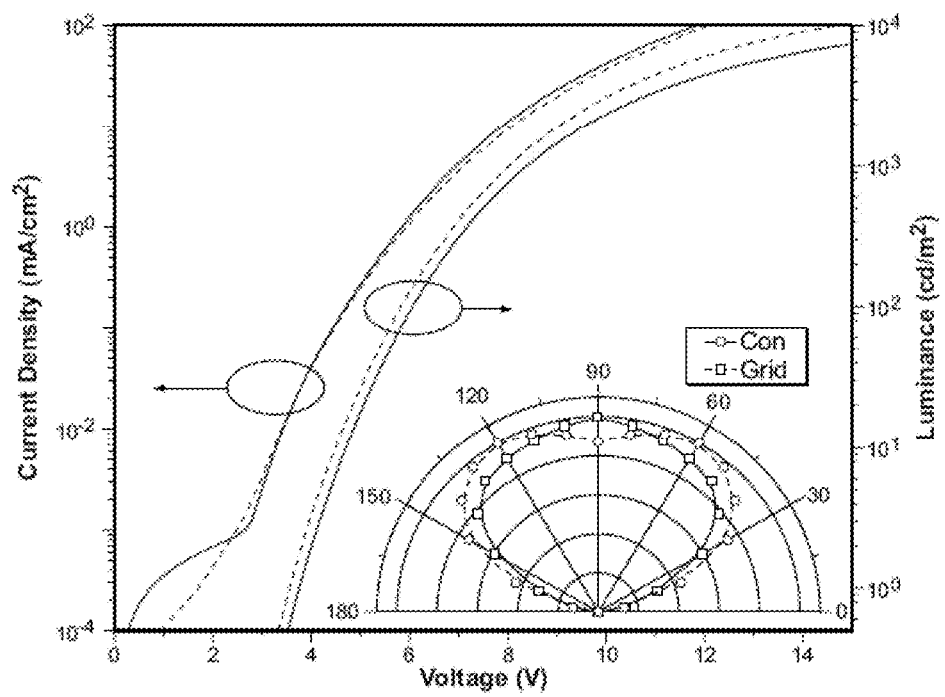
FIG. 11A shows the current-density-voltage characteristics and (inset) the angular intensity profiles of control and metal coated grid devices according to an embodiment disclosed herein.
Figure 11B:
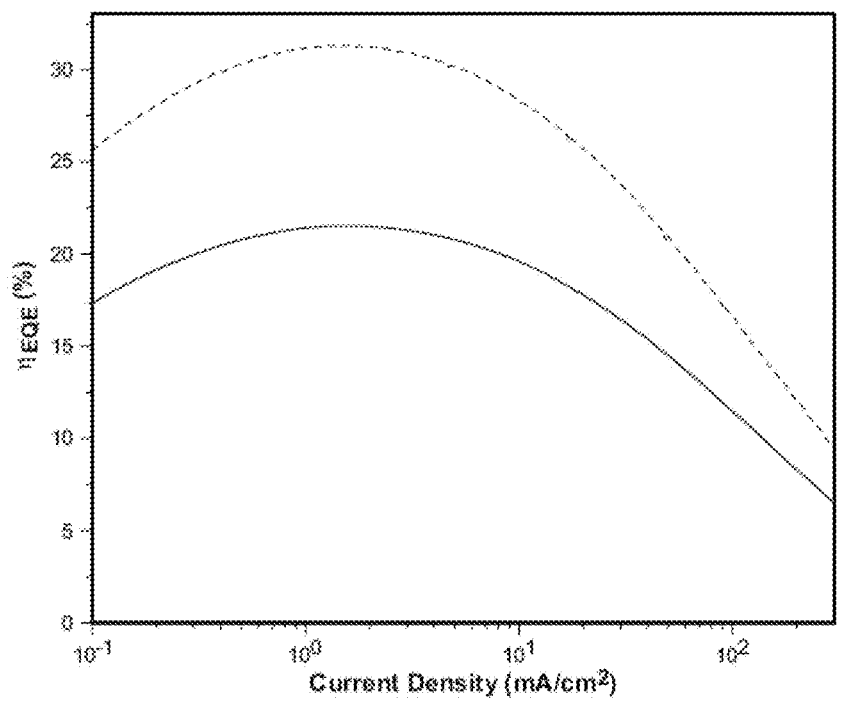
FIG. 11B shows the external quantum efficiencies of the same devices.
Figure 11C:
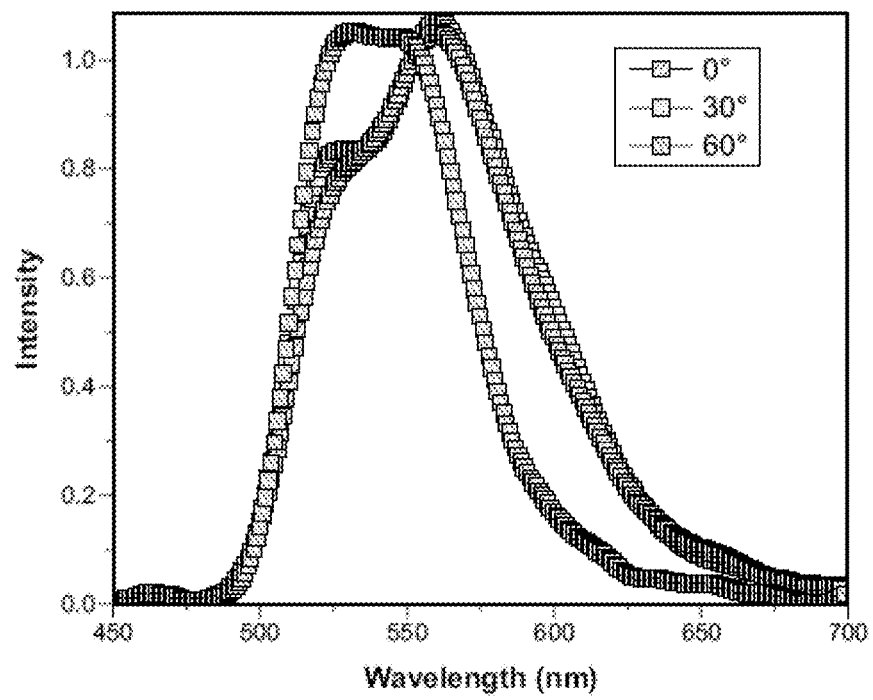
FIG. 11C shows the emission spectra of the (c) control device and FIG. 11D shows the emission spectra of the grid device as disclosed herein with a $MgF_2$ AR coating at 0°, 30°, 60° with 2° error.
Figure 11D:
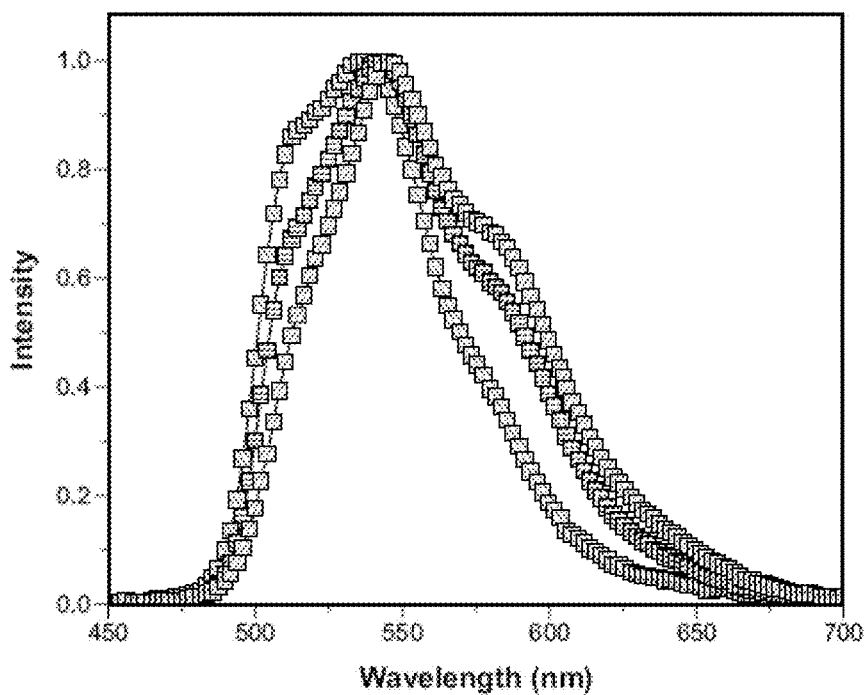

The bottom MoO$_3$ layer reduces electrical shorts that penetrate the spacer layer created by protrusions left from the grid lithography process. The top MoO$_3$ layer prevents damage to the organic active region during the IZO sputtering process as disclosed in further detail herein. The control device has a 150 nm thick, planar Ag layer covered with 65 nm SiO2 spacer layer beneath the active region. The grid reflector is an array of 1×3 μm raised rectangles surrounding 3×3 μm and 1×1 μm square depressions, with the spacer thicknesses given above. Both devices are capped with a 70 nm thick MgF$_2$ AR coating. The current density-voltage curves of both devices are identical above turn on (~3V) as shown in FIG. 11A. Furthermore, the $\eta_{EQE}$ is increased from 20±1% to 30±2% using the metallic scattering grid, as shown in FIG. 11B. The angular intensity profiles of the devices with the AR layer are broadened from a simple Lambertian emission profile. The peak intensity of the control device is normal to the surface, whereas the grid OLED intensity is at a maximum at 20° from normal. The spectra of the control (FIG. 11C) and the metal coated grid (FIG. 11D) OLEDs are shown at 0°, 30° and 60°. Both devices have spectral peaks at =550 nm. Compared with the control, the grid device shows a slightly increased blue shift at large angles.

The emission intensity is a function of the overlap between the cavity resonance and the emission spectrum. The microcavity resonance peak (at λ≈540 nm, see FIG. 10A-10B) is redshifted from the emission spectral peak (λ≈510 nm). Thus, the blue shift with angle results in broader than the Lambertian angular intensity profiles for the control and grid devices shown in FIG. 11A, inset. The broadening of the grid OLED spectrum is more severe because the capping layer thickness, which reduces the cavity quality, was optimized for the thin cavity region of the grid devices, which is the same as the spacer layer thickness used in the control device.

Although it was found that a significant enhancement in efficiency was obtained using the reflecting grid, 60% of the optical power is still lost in the device. In addition to the limited grid scattering efficiency due to the spacer thickness used, the scattered light incurs losses at each reflection from the metal surface. A diffuser film or MLA comprised of high refractive index materials added to the top surface of the control devices should also generate higher efficiencies by reducing the cavity quality factor. The weaker cavity produced by these strategies is also beneficial for outcoupling white light. Using the fact that a MLA foil extracts more than half of optical power going into the foil, the Green's function analysis shows MLA on the device emitting surface could further improve the efficiency by 30% at least.

The top-emitting device with IZO/MoO$_3$ electrodes achieved $\eta_{EQE}$=20±1%, with almost no excitation of SPP modes. The efficiency is increased to 30±2% by using a metal coated scattering grid layer beneath the anode without impacting the OLED electrical characteristics. The efficiency can be further improved using MLA or diffuser on the device emitting surface. The grid scatters the waveguided power and reduces plasmonic losses. The metallic scattering grid is fabricated within the substrate, and hence is totally separate from the organic active layers, allowing for considerable freedom in both the OLED and grid optical designs. Note that if the insulating spacer layer is replaced with a low resistance transparent metal oxide, it can be used as a conductive layer used for addressing OLED pixels in an active matrix display. This is just one of several possibilities allowed by this sub-electrode light scattering approach.

The fabrication sequence for the metallic scattering layer is shown in FIG. 12A. A 245 nm SiO$_2$ film was deposited by electron-beam evaporation on a glass substrate pre-coated with sacrificial lift-off resist (MicroChem LOR 10B) (4000 r.p.m., 180° C.). Photoresist (Microposit S1813) was subsequently coated at 4000 r.p.m. and cured at 115° C. for 90 s. The pattern was photolithographically defined using an AutoStep exposure system (GCA AS200) with an exposure time of 0.33 s. The 180 nm deep etch of the SiO2 film was done using a 1:1 CF4:CHF3 plasma at 100 W. The photoresist was removed by exposure to oxygen plasma for 3 min at 800 W. Then a 150 nm thick Ag film was deposited by thermal evaporation after a 2 nm thick Ti wetting layer. Next a 5 nm thick Ge wetting layer followed by a 200 nm thick Au film was deposited by electron-beam evaporation at 10 Å/s onto the surface of a clean glass and Ag/SiO$_2$/glass substrate. The two glass substrates were then sealed together via cold-weld bonding by applying heat (200° C.) and pressure (4 MPa) for 5 min under vacuum (10$^{-3}$ Torr) using an EVG 510 wafer bonder. The bonding is sufficiently robust to survive sonication, although the Au surface on the grid is irregular due to the SiO2 trenches, leaving vacancies at the bonding interface. The bonded glass slabs are diced into 1×1 inch squares, which were soaked in Remover PG (MicroChem at 80° C.) to dissolve the sacrificial LOR layer to leave the metallic coated grid. After the grid preparation, a 50 nm thick IZO layer was deposited at 60 W in a chamber with an Ar pressure of 2 mTorr at a rate of 0.6 Å/s using a radio-frequency magnetron sputterer.

The control substrate was prepared as follows: A glass substrate was cleaned using sonication in tergitol, de-ionized water, acetone, and isopropanol (IPA). A 2 nm thick Ti wetting layer and 150 nm thick Ag layer were sequentially deposited by thermal evaporation, followed by a 65 nm thick SiO$_2$ film by electron-beam evaporation, and 50 nm thick IZO by sputtering (23 ohm/sq). The area was defined by a shadow mask without breaking vacuum between depositions.

The IZO-coated substrates were cleaned for 3 min by sonication in IPA and exposed to ultraviolet-ozone before PHOLED layer deposition by vacuum thermal evaporation in a system with a base pressure of 10$^{-7}$ torr. The first MoO3 layer was deposited at 0.5 Å/s, and the top MoO$_3$ layer at 0.05 Å/s for the first 5 nm and at 0.2 Å/s for the remaining thickness in the same chamber as the organic layers. The top IZO electrode was sputter-deposited in a chamber with an Ar pressure of 5 mTorr at 0.05 Å/s for the first 10 nm, and 2 mTorr at 0.2 Å/s for the remaining thickness. Finally, the MgF$_2$ capping layer was thermally deposited. The refractive indices and thicknesses of materials were measured using a variable-angle spectroscopic ellipsometer (J. A. Woollam WVASE32). Current-voltage-luminance characteristics were collected using a semiconductor parameter analyzer (HP-4156A) and a calibrated Si photodiode. The electroluminescence spectra were measured using an Ocean Optics miniature spectrometer. The $\eta_{EQE}$ was calculated using standard methods.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A device comprising:
 a substrate;
 an organic light emitting diode (OLED) disposed over the substrate, the OLED comprising an organic emissive layer disposed between a first electrode and a second electrode;
 a reflective layer disposed in a stack with the OLED and comprising a rectangular grid of raised regions of a reflective material, the raised regions having a first thickness; and
 a dielectric layer comprising a dielectric material disposed in a stack with the OLED and the reflective layer;
 wherein the reflective layer comprises a blanket layer extending across the stack without gaps in the reflective layer, and wherein portions of the reflective layer that are not in the rectangular grid of raised regions have a non-zero second thickness that is different than the first thickness.

2. The device of claim 1, wherein the dielectric layer is disposed between the reflective layer and the OLED.

3. The device of claim 1, wherein the dielectric layer is disposed between the OLED and the substrate.

4. The device of claim 3, further comprising an anti-reflective layer disposed above the OLED.

5. The device of claim 1, wherein the reflective layer comprises at least one material selected from the group consisting of: Ag, Al, chromium, Au, platinum, and alloys thereof.

6. The device of claim 1, wherein the reflective layer comprises a multi-layer dielectric or a distributed Bragg reflector.

7. The device of claim 1, wherein the grid has a periodicity of at least twice a peak wavelength of light emitted by the OLED.

8. The device of claim 7, wherein the grid has a periodicity of not more than 20 microns.

9. The device of claim 1, wherein the dielectric material extends into regions between the raised regions of the reflective layer.

10. The device of claim 1, wherein the dielectric material has an index of refraction of not more than 2.2.

11. The device of claim 9, wherein the dielectric material has an index of refraction of not more than 1.5.

12. The device of claim 1, wherein the dielectric layer has a thickness of at least 5 nm.

13. The device of claim 1, wherein the first electrode is transparent.

14. The device of claim 13, wherein the second electrode is transparent.

15. The device of claim 1, wherein the dielectric material comprises at least one selected from the group consisting of transparent silicon oxide, magnesium fluoride.

16. The device of claim 4, further comprising an additional reflective layer disposed between the OLED and the substrate.

* * * * *